(12) United States Patent
Kim et al.

(10) Patent No.: US 10,868,270 B2
(45) Date of Patent: Dec. 15, 2020

(54) DISPLAY DEVICE

(71) Applicant: LG Display Co., Ltd., Seoul (KR)

(72) Inventors: UnJung Kim, Osan-si (KR); MinSeok Kim, Osan-si (KR); JiHun Song, Osan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/127,510

(22) Filed: Sep. 11, 2018

(65) Prior Publication Data
US 2019/0131564 A1 May 2, 2019

(30) Foreign Application Priority Data
Oct. 31, 2017 (KR) .................. 10-2017-0143936

(51) Int. Cl.
| | | |
|---|---|---|
| *H01L 51/52* | (2006.01) | |
| *H01L 27/32* | (2006.01) | |
| *H01L 51/00* | (2006.01) | |
| *G09G 3/3266* | (2016.01) | |
| *G09G 3/3275* | (2016.01) | |

(52) U.S. Cl.
CPC ...... *H01L 51/5237* (2013.01); *H01L 27/3244* (2013.01); *H01L 27/3262* (2013.01); *H01L 51/0097* (2013.01); *H01L 51/5253* (2013.01); *G09G 3/3266* (2013.01); *G09G 3/3275* (2013.01); *G09G 2310/08* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2014/0346473 A1* | 11/2014 | Park | H01L 51/5256 |
| | | | 257/40 |
| 2015/0091005 A1 | 4/2015 | Park | |
| 2015/0200333 A1* | 7/2015 | Okumoto | H01L 51/0097 |
| | | | 257/79 |
| 2015/0263312 A1* | 9/2015 | Kanegae | H01L 29/78609 |
| | | | 257/40 |
| 2016/0322403 A1 | 11/2016 | Gao et al. | |
| 2017/0317216 A1* | 11/2017 | Lee | H01L 27/1225 |
| 2018/0035553 A1 | 2/2018 | Liu | |
| 2018/0226613 A1* | 8/2018 | Kang | H01L 51/5237 |
| 2019/0221626 A1* | 7/2019 | Li | H01L 27/3262 |

FOREIGN PATENT DOCUMENTS

| | | |
|---|---|---|
| CN | 104392901 A | 3/2015 |
| CN | 104518000 A | 4/2015 |
| CN | 105244366 A | 1/2016 |
| JP | 2005-195749 A | 7/2005 |
| KR | 10-2015-0109557 A | 10/2015 |

OTHER PUBLICATIONS

Chinese Office Action dated Jul. 3, 2020 issued in corresponding Application No. 201811143956.1 w/partial translation (13 pages).

* cited by examiner

*Primary Examiner* — Dung A. Le
(74) *Attorney, Agent, or Firm* — Polsinelli PC

(57) ABSTRACT

A display device is disclosed, which may prevent a dark spot defect caused by water permeation from occurring and reduce accumulated stress. The display device comprises a substrate having a barrier pattern; and a thin film transistor provided on the substrate.

17 Claims, 6 Drawing Sheets

DISPLAY DEVICE

CROSS REFERENCE TO RELATED APPLICATION

This application claims the benefit of the Korean Patent Application No. 10-2017-0143936 filed on Oct. 31, 2017, which is hereby incorporated by reference in its entirety as if fully set forth herein.

BACKGROUND

Field of the Disclosure

The present disclosure relates to a display device.

Description of the Background

With the advancement of the information age, a demand for a display device for displaying an image has been increased in various forms. Recently, a display device of a slimmer size has been launched. Particularly, a flexible organic light emitting display device has many advantages in that it is easy to carry it and may be applied to various shaped devices.

Since a flexible display device may be folded or rolled the substrate like a paper, the flexible display device has been consistently studied as a next generation display device owing to advantages of portability and storage. For example, the flexible display devices may include the liquid crystal display devices, the light emitting display devices, the electrophoretic display devices, the micro light emitting display devices, the electro-wetting display device, or the quantum dot light emitting display devices.

In order to realize the flexible display device, a flexible substrate, an organic/inorganic material for low temperature process, a light emitting diode, a passivation film, a shielding film and the like are required complexly. Among them, the flexible substrate is recognized as the most important part for determining performance, reliability, cost, etc. of the flexible display device.

However, a problem occurs in that a crack is caused in a buffer layer by particles generated during the manufacturing process in the flexible substrate, whereby waterproof effect and/or property may be deteriorated or a dark spot defect is generated.

The background art described as above is technical information owned by the inventors of the present disclosure to devise the present disclosure or obtained during the step of devising the present disclosure, and may not necessarily be regarded as the known art disclosed to the public before filing of the present disclosure.

SUMMARY

The present disclosure has been made in view of the above problems, and it is an object of the present disclosure to provide a display device that may prevent a dark spot defect caused by water permeation and reduce accumulated stress.

In accordance with an aspect of the present disclosure, the above and other objects can be accomplished by the provision of a display device comprising a substrate having a barrier pattern; and a thin film transistor provided on the substrate.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
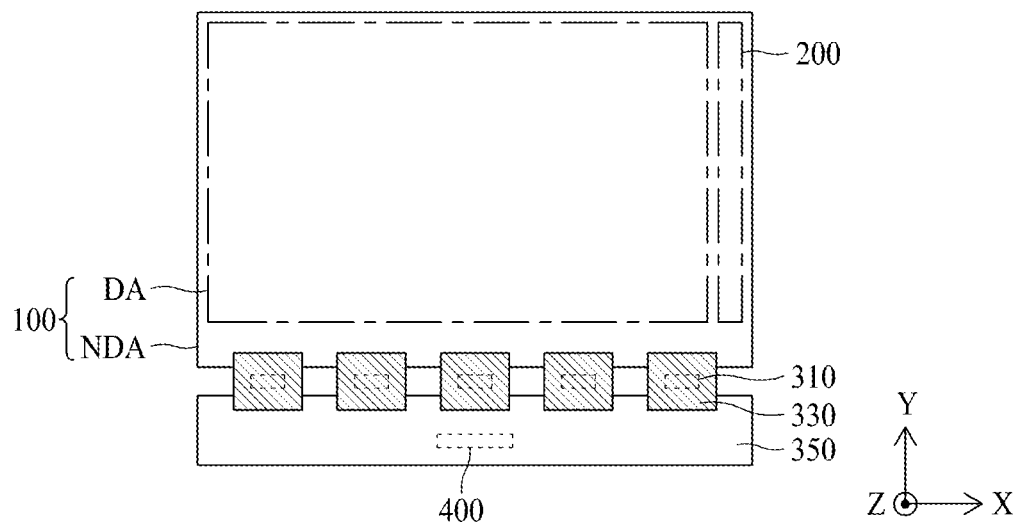
FIG. 1 is a plane view illustrating a display device according to the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"A first horizontal-axis direction", "a second horizontal-axis direction" and "a vertical-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, the aspects of the present disclosure will be described in detail with references to the accompanying drawings. Wherever possible, the same reference numbers will be used throughout the drawings to refer to the same or like parts.

FIG. 1 is a plane view illustrating a display device according to the present disclosure. In FIG. 1, X-axis indicates a direction parallel to a gate line, Y-axis indicates a direction parallel to a data line, and Z-axis indicates a height direction of the display device.

Referring to FIG. 1, the display device according to the present disclosure comprises a substrate 100, a gate driver 200, a source drive integrated circuit (hereinafter, referred to "IC") 310, a flexible film 330, a circuit board 350, and a timing controller 400.

The substrate 100 is a thin film array substrate, and may be made of a plastic material. The substrate 100 according to one example includes a display area DA and a non-display area NDA.

The display area DA may be defined as an area for displaying an image. On the display area DA, gate lines, data lines and pixels may be disposed.

The non-display area NDA is an area surrounding at least one edge of the display area DA, and may be defined as an area for not displaying an image. On the non-display area NDA, a gate driver 200 and pads may be disposed.

The gate driver 200 supplies gate signals to the gate lines in accordance with a gate control signal received from the timing controller 400. The gate driver 200 may be formed on the non-display area NDA outside one side or both sides of the display area DA of the substrate 100 in a gate driver in panel (GIP) mode. Alternatively, the gate driver 200 may be fabricated of a driving chip, packaged in a flexible film 330 and attached to the non-display area NDA outside one side or both sides of the display area DA of the substrate 200 in a tape automated bonding (TAB) mode.

The source drive IC 310 receives digital video data and a source control signal from the timing controller 400. The source drive IC 310 converts the digital video data to analog data voltages in accordance with the source control signal and supplies the analog data voltages to the data lines. If the source drive IC 310 is fabricated of a driving chip, the source drive IC 310 may be packaged in the flexible film 330 in a chip on film (COF) or chip on plastic (COP) mode.

The flexible film 330 is attached to the pads by an anisotropic conducting film. Lines which connect the pads to the source drive IC 310 and lines which connect the pads to lines of the circuit board 350 may be formed in the flexible film 330.

The circuit board 350 may be attached to the flexible films 330. A plurality of circuits for the driving chips may be packaged in the circuit board 350. For example, the timing controller 400 may be packaged in the circuit board 350. The circuit board 350 may be a printed circuit board or a flexible printed circuit board.

The timing controller 400 receives digital video data and a timing signal from an external system board through a cable of the circuit board 350. The timing controller 400 generates a gate control signal for controlling an operation timing of the gate driver 200 and a source control signal for controlling the source drive ICs 310 on the basis of the timing signal. The timing controller 400 supplies the gate control signal to the gate driver 200, and supplies the source control signal to the source drive ICs 310.

Figure 2:
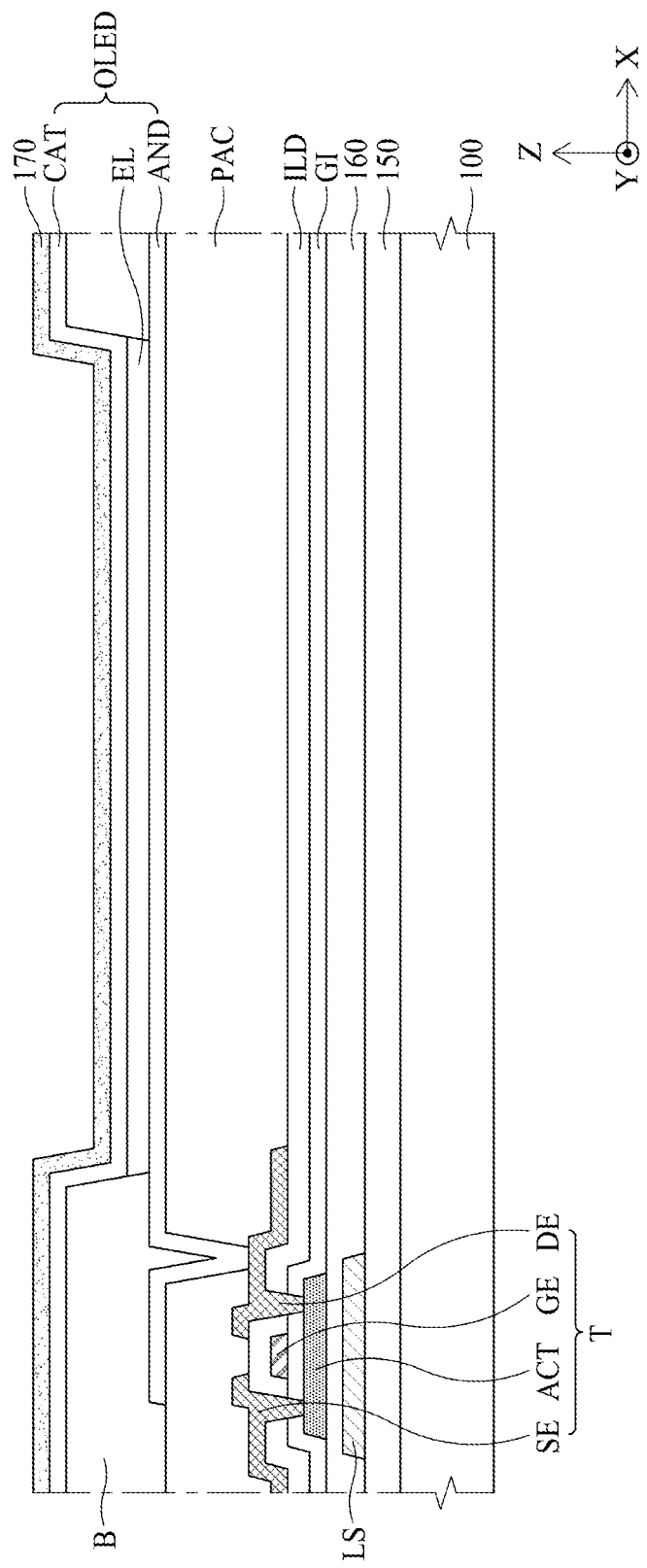
FIG. 2 is a cross-sectional view illustrating a display device according to the present disclosure.

FIG. 2 is a cross-sectional view illustrating a display device according to the present disclosure. FIG. 2 briefly illustrates a cross-section of one side of the display area DA shown in FIG. 1.

Referring to FIG. 2, the display device according to the present disclosure includes a substrate 100, a barrier layer 150, a light-shielding layer LS, a buffer layer 160, a thin film transistor T, a planarization layer PAC, an organic light emitting diode OLED, and an encapsulation layer 170.

The substrate 100 may be a flexible plastic sheet or film. For example, the substrate 100 may be, but not limited to, a sheet or film that includes cellulose resin such as TAC (triacetyl cellulose) or DAC (diacetyl cellulose), COP (cyclic olefin polymer) such as norbornene derivatives, COC (cyclo olefin copolymer), acryl resin such as PMMA (poly (methylmethacrylate)), polyolefin such as PC (polycarbonate), PE (polyethylene) or PP (polypropylene), polyester such as PVA (polyvinyl alcohol), PES (poly ether sulfone), PEEK (polyetheretherketone), PEI (polyetherimide), PEN (polyethylenenaphthalate), and PET (polyethyleneterephthalate), PI (polyimide), PSF (polysulfone), or fluoride resin.

The barrier layer 150 is provided on the substrate 100. The barrier layer 150 serves to prevent water from being permeated into the substrate 100 or protect the thin film transistor T and the organic light emitting diode OLED from external pressure or forces. The barrier layer 150 may be made of, but not limited to, an inorganic insulating material, for example, $SiO_2$ (silicon dioxide), SiNx (silicon nitride), or a multi-layered film of $SiO_2$ and SiNx.

The light-shielding layer LS is provided on the barrier layer 150. The light-shielding layer LS serves to prevent external light from entering into an active layer ACT of the thin film transistor T. The light-shielding layer LS does not need to formed in a pattern as shown in figures, and may be modified in various patterns. The light-shielding layer LS may be formed of a metal material.

The buffer layer 160 is provided on the barrier layer 150 to cover the light-shielding layer LS. The buffer layer 160 serves to prevent water from being permeated into pixels. The buffer layer 160 may be made of, but not limited to, an inorganic insulating material, for example, $SiO_2$ (silicon dioxide), SiNx (silicon nitride), or a multi-layered film of $SiO_2$ and SiNx.

The thin film transistor T is arranged on the substrate 100. The thin film transistor T includes an active layer ACT, a gate insulating film GI, a gate electrode GE, an inter-layer dielectric film ILD, a source electrode SE and a drain electrode DE.

The active layer ACT is arranged to overlap with the gate electrode GE. The active layer ACT may include one end area corresponding to the source electrode SE, the other end area corresponding to the drain electrode DE, and a center area disposed between the one end area and the other end area. In this case, the center area may be made of a semiconductor material which is not doped with a dopant material, and the one end area and the other end area may be made of a semiconductor material doped with a dopant material.

The gate insulating film GI is provided on the active layer ACT. The gate insulating film GI serves to insulate the active layer ACT from the gate electrode GE. The gate insulating film GI is provided to cover the active layer ACT. The gate insulating film GI may be made of, but not limited to, an inorganic insulating material, for example, $SiO_2$ (silicon dioxide), SiNx (silicon nitride), or a multi-layered film of $SiO_2$ and SiNx.

The gate electrode GE is provided on the gate insulating film GI. The gate electrode GE is overlapped with the center area of the active layer ACT by interposing the gate insulating film GI therebetween. The gate electrode GE may be, but not limited to, a single layer or multi-layer including at least any one of Mo, Al, Cr, Au, Ti, Ni, Nd and Cu or their alloy.

The inter-layer dielectric film ILD is provided on the gate electrode GE. The inter-layer dielectric film ILD serves to insulate the gate electrode GE from the source electrode SE and the drain electrode DE. The inter-layer dielectric film ILD may be made of, but not limited to, an inorganic insulating material, for example, $SiO_2$, SiNx, or a multi-layered film of $SiO_2$ and SiNx.

The source electrode SE and the drain electrode DE are arranged to be spaced apart from each other on the inter-layer dielectric film ILD. The source electrode SE is connected to the one end area of the active layer ACT, and the drain electrode DE is connected to the other end area of the active layer ACT.

The aforementioned thin film transistor is not limited to the aforementioned example, and various modifications may be made in the thin film transistor by the known elements that may easily be carried out by the ordinary skilled persons in the art.

The planarization layer PAC is provided on the source electrode SE and the drain electrode DE. The planarization layer PAC serves to protect the thin film transistor T and to planarize a top surface of the substrate 100 provided with the thin film transistor T. The planarization layer PAC may be made of, but not limited to, an organic insulating material such as acrylic resin, epoxy resin, phenolic resin, polyamides resin, and polyimides resin.

An inorganic insulating film may additionally be provided between the planarization layer PAC and the thin film transistor T. The inorganic insulating film serves to protect the thin film transistor T. In this case, the inorganic insulating film may be made of the same inorganic insulating material as that of the gate insulating film GI, for example, but not limited to, $SiO_2$, SiNx, or a multi-layered film of $SiO_2$ and SiNx.

The organic light emitting diode OLED is provided on the thin film transistor T. The organic light emitting diode OLED includes an anode electrode AND, an organic layer EL, and a cathode electrode CAT.

The anode electrode AND is provided on the planarization layer PAC and connected to the drain electrode DE of the thin film transistor T. A bank B is provided between two anode electrodes AND adjacent to each other, whereby the bank B may be made of, but not limited to, an organic insulating material such as polyimides resin, acrylic resin, and benzocyclobutene (BCB).

The organic layer EL is provided on the anode electrode AND. The organic layer EL may include a hole transporting layer, an organic light emitting layer, and an electron transporting layer. Moreover, the organic layer EL may further include at least one functional layer for improving emission efficiency and/or lifespan of the light emitting layer.

The cathode electrode CAT is provided on the organic layer EL and the bank B. When a voltage difference is applied between the anode electrode AND and the cathode electrode CAT, holes and electrons are moved to the organic light emitting layer through the hole transporting layer and the electron transporting layer, respectively, and are combined with each other to emit lights.

The encapsulation layer 170 is provided on the organic light emitting diode OLED. The encapsulation layer 170 is provided on the cathode electrode CAT. The encapsulation layer 170 may be provided on an entire surface of the display area DA. The encapsulation layer 170 protects the thin film transistor T and the organic light emitting diode OLED from external impact. Also, the encapsulation layer 130 serves to prevent water, moisture and/or particles from being permeated into the substrate 100.

Figure 3:
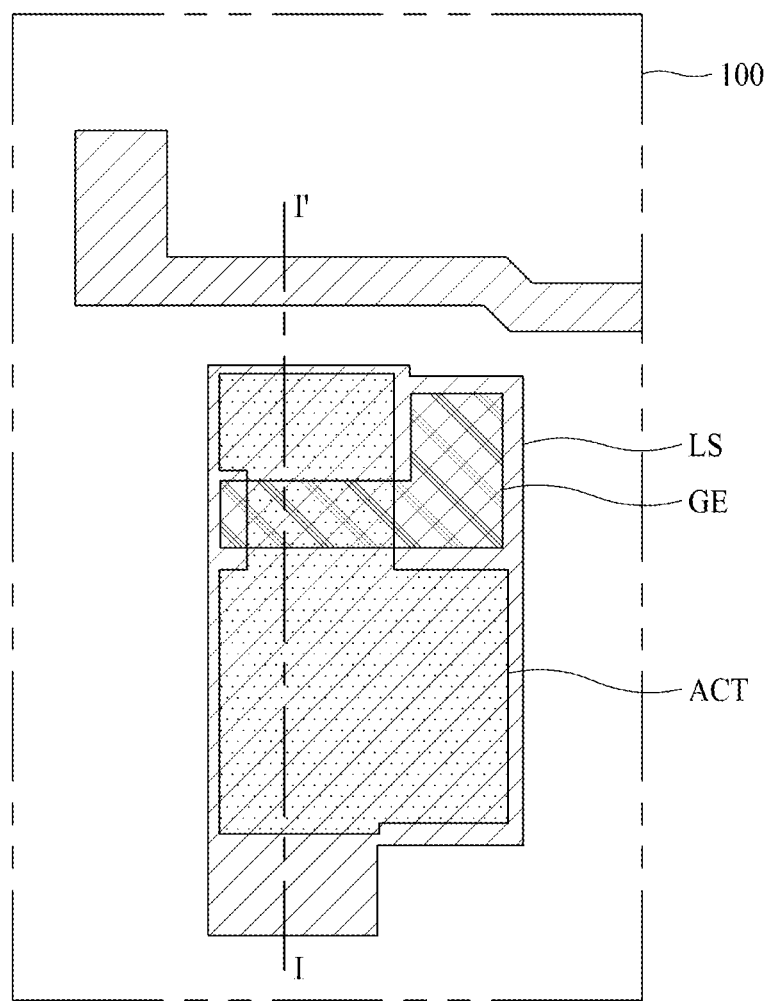
FIG. 3 is an accumulated plane view illustrating a structure of a portion of a thin film transistor.
Figure 4:
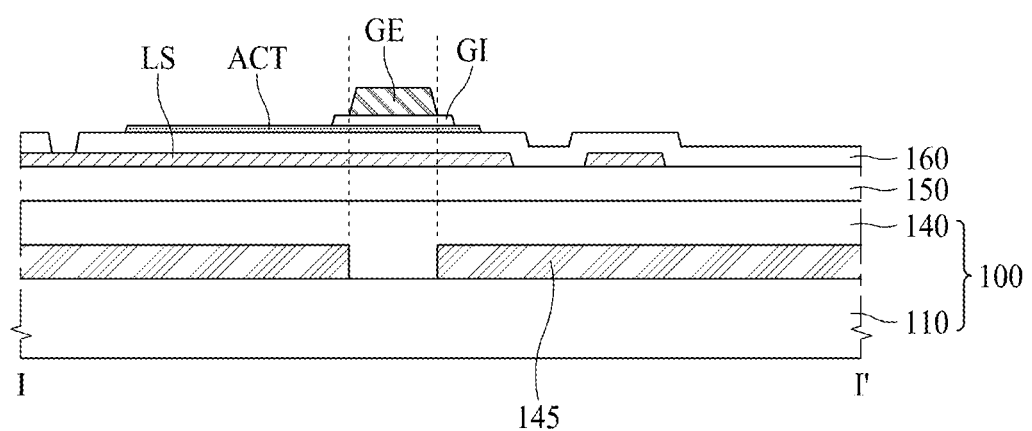
FIG. 4 is a cross-sectional view taken along line I-I' of FIG. 3 according to a first aspect of the disclosure.

FIG. 3 is an accumulated plane view illustrating a structure of a portion of a thin film transistor. FIG. 4 is a cross-sectional view taken along line I-I' of FIG. 3 according to the first aspect. FIGS. 3 and 4 correspond to the drawings for illustrating an arrangement structure of a gate electrode and a substrate. The elements of portions not shown separately are the same as those shown in FIG. 2. Hereinafter, the same reference numerals will be given to the same elements as those of FIG. 2, and a same description will not be duplicated.

Referring to FIGS. 3 and 4, the display device according to a first aspect of the present disclosure comprises a substrate 100.

The substrate 100 may be a base substrate for a thin film transistor array substrate, and may be made of a plastic material. The substrate 100 includes a barrier pattern. Further, the substrate 100 may include a lower layer 110 and an upper layer 140 which are stacked sequentially.

The barrier pattern serves to prevent water from being permeated into the pixels. In one example, the barrier pattern may be regarded as a first barrier pattern 145. The barrier pattern may be made of an inorganic insulating material, for example, but not limited to, $SiO_2$, SiNx, or a multi-layered film of $SiO_2$ and SiNx.

The barrier pattern is provided on some area of the substrate 100 in a pattern type. Since the barrier pattern is provided in a pattern type, the accumulated stress subjected to the substrate 100 may be suppressed and the flexibility of the substrate 100 may be prevented from being deteriorated.

The barrier pattern may be formed so as not to overlap the gate electrode GE of the thin film transistor T. Since the barrier pattern is formed in an area which is not overlapped with the gate electrode GE, the stress applied to the barrier layer 150 at the area overlapped with the gate electrode GE may be reduced.

Since the gate electrode GE is arranged to be adjacent to the substrate 100 and formed of a metal material, the gate electrode GE has a strong pressed force. When the barrier pattern is formed in the area overlapped with the gate electrode GE, the strong pressed force is further increased by process particles included in the substrate 100, so that the much stronger pressed force is applied to the barrier layer 150 from both upside and downside, whereby a crack may be generated in the barrier layer 150 easily. Unlike this case, in the display device according to the present disclosure, the barrier pattern is formed in the area which is not overlapped with the gate electrode GE. Since the pressed force applied to the barrier layer 150 from upside and downside is not great, the stress applied to the barrier layer 150 may be reduced, and a crack may be prevented from being generated in the barrier layer 150.

The lower layer 110 is a layer disposed at the lowermost end of the substrate 100, and corresponds to a layer spaced farthest apart from the thin film transistor T. The lower layer 110 corresponds to a layer separated from a glass substrate by LLO (Laser Lift-Off) process, and a separate sacrificial layer may exist between the lower layer 110 and the glass substrate. The lower layer 110 may be regarded as a layer that does not include any barrier pattern 145 to facilitate separation from the glass substrate.

The upper layer 140 is provided on the lower layer 110. The upper layer 140 is arranged between the lower layer 110 and the thin film transistor T. The upper layer 140 may be regarded as a layer that includes a barrier pattern.

Since the substrate 100 according to the present disclosure has a stacked structure of the lower layer 110 and the upper layer 140, a permeation path of external water, moisture or oxygen may be getting longer, whereby the time required to generate a dark spot defect may be delayed. Also, since the lower layer 110 and the upper layer 140 may be formed of a high elastic material, a cushion effect may be enhanced in the stacked structure of the lower layer 110 and the upper layer 140.

Since the substrate 100 according to the present disclosure includes a barrier pattern, water may be prevented from being permeated into the pixels while flexibility of the substrate 100 is not being deteriorated. Since the barrier pattern is formed in the area which is not overlapped with the gate electrode GE, a crack may be prevented from being generated in the barrier layer 150.

Figure 5:
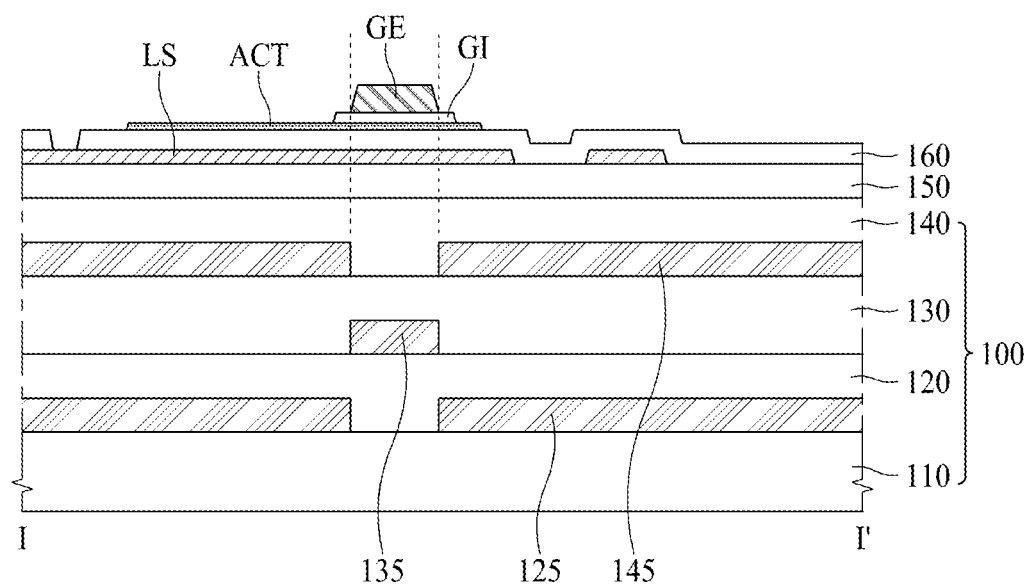
FIG. 5 is a cross-sectional view taken along line I-I' of FIG. 3 according to a second aspect of the disclosure.

FIG. 5 is a cross-sectional view taken along line I-I' of FIG. 3 according to a second aspect. FIG. 5 corresponds to a drawing for illustrating an arrangement structure between a gate electrode and a substrate. The elements of portions which are not shown separately are the same as those shown in FIG. 2. Hereinafter, the same reference numerals will be given to the same elements as those of FIG. 2, and a same description will be duplicated.

Referring to FIGS. 3 and 5, the display device according to a second aspect of the present disclosure comprises a substrate 100.

The substrate 100 may be a base substrate for a thin film transistor array substrate, and may be made of a plastic material. The substrate 100 includes a barrier pattern, and may be made of a stacked structure of a lower layer 110, first to Nth intermediate layers and an upper layer 140.

The barrier pattern serves to prevent water from being permeated into the pixels. In this case, the barrier pattern may be regarded as first barrier patterns 125 and 145 and a second barrier pattern 135. These barrier patterns may be made of an inorganic insulating material, for example, but not limited to, $SiO_2$, SiNx, or a multi-layered film of $SiO_2$ and SiNx.

The barrier pattern is provided on some area of the substrate 100 in a pattern type. Since the barrier pattern is provided in a pattern type, the accumulated stress subjected to the substrate 100 may be suppressed and the flexibility of the substrate 100 may be prevented from being deteriorated.

The lower layer 110 is a layer disposed at the lowest end of the substrate 100, and corresponds to a layer spaced farthest apart from the thin film transistor T. The lower layer 110 corresponds to a layer separated from a glass substrate by LLO process, and a separate sacrificial layer may exist between the lower layer 110 and the glass substrate. The lower layer 110 may be regarded as a layer that does not include any barrier pattern to facilitate separation from the glass substrate.

The first to Nth intermediate layers are provided between the lower layer 110 and the upper layer 140. The first intermediate layer is directly in contact with the upper layer, the Nth intermediate layer is directly in contact with the lower layer, and the second to N−1th intermediate layers are sequentially arranged between the first intermediate layer and the Nth intermediate layer.

In this case, the first to Nth intermediate layers may include first to (2j−1)th intermediate layers 130 (j is a natural number smaller than or equal to (N+1)/2) and second to (2i)th intermediate layers 120 (i is a natural number smaller than or equal to N/2).

The first to (2j−1)th intermediate layers 130 are the odd numbered intermediate layers, and may include the first intermediate layer which is directly in contact with the upper layer 140, a third intermediate layer disposed below the second intermediate layer, a fifth intermediate layer disposed below the fourth intermediate layer, etc.

The second to (2i)th intermediate layers 120 are the even numbered intermediate layers, and may include a second intermediate layer disposed below the first intermediate layer, a fourth intermediate layer disposed below the third intermediate layer, etc.

FIG. 5 illustrates a case of N=2, for example. The structure of the display device according to the present disclosure is not limited to the example of FIG. 5. Although FIG. 5 illustrates that the even numbered intermediate layer 120 is directly in contact with the lower layer 110, the odd numbered intermediate layer 130 may directly be in contact with the lower layer 110 without limitation to the example of FIG. 5.

The upper layer 140 is provided on the first intermediate layer 130.

Since the substrate 100 according to the present disclosure has a stacked structure of the lower layer 110, the first to Nth intermediate layers, and the upper layer 140, a permeation path of external water, moisture or oxygen may be increased, whereby the time required to generate a dark spot defect may be delayed. Also, since the lower layer 110, the first to Nth intermediate layers and the upper layer 140 may be formed of a high elastic material, a cushion effect may be enhanced in the stacked structure of the lower layer 110, the first to Nth intermediate layers and the upper layer 140. In this case, N is a natural number, and the number of intermediate layers is increased if N becomes great. If the number of intermediate layers is increased, the cushion effect may be more enhanced.

The barrier pattern is formed in the upper layer 140 and the first to Nth intermediate layers. In this case, the first barrier patterns 125 and 145 are formed in the upper layer 140 and the second to (2i)th intermediate layers 120, and the second barrier pattern 135 is formed in the first to (2j−1)th intermediate layers.

The first barrier patterns 125 and 145 and the second barrier pattern 135 are formed so as not to be overlapped with each other. Since the first barrier patterns 125 and 145 are formed to cross the second barrier pattern 135 without being overlapped with the second barrier pattern 135, accumulated stress applied to the substrate 100 may be suppressed.

The first barrier patterns 125 and 145 are formed so as not to be overlapped with the gate electrode GE and the second barrier pattern 135 is formed to be overlapped with the gate electrode GE. As described above, the first barrier pattern 145 formed in the upper layer 140 is not overlapped with the gate electrode GE to prevent a crack from being generated in the barrier layer 150. Since the first barrier patterns 125 and 145 are formed so as not to be overlapped with the gate electrode GE, the second barrier pattern 135 formed to cross the first barrier patterns 125 and 145 is overlapped with the gate electrode GE. In this case, the first barrier patterns 125 and 145 may be regarded as including the first barrier pattern 145 formed in the upper layer 140 and the first barrier pattern 125 formed in the second to (2i)th intermediate layers. The first barrier patterns 125 and 145 are the same patterns, and their respective reference numerals are given to these first barrier patterns for convenience.

Figure 6:
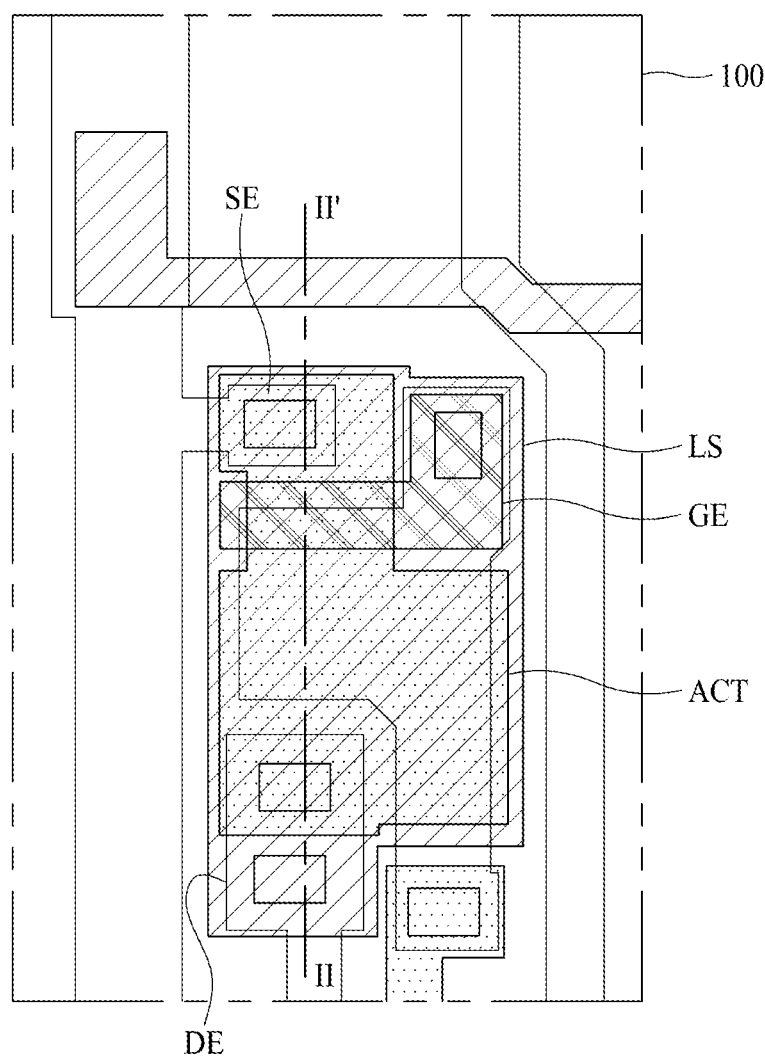
FIG. 6 is an accumulated plane view illustrating a structure of a portion of a thin film transistor.
Figure 7:
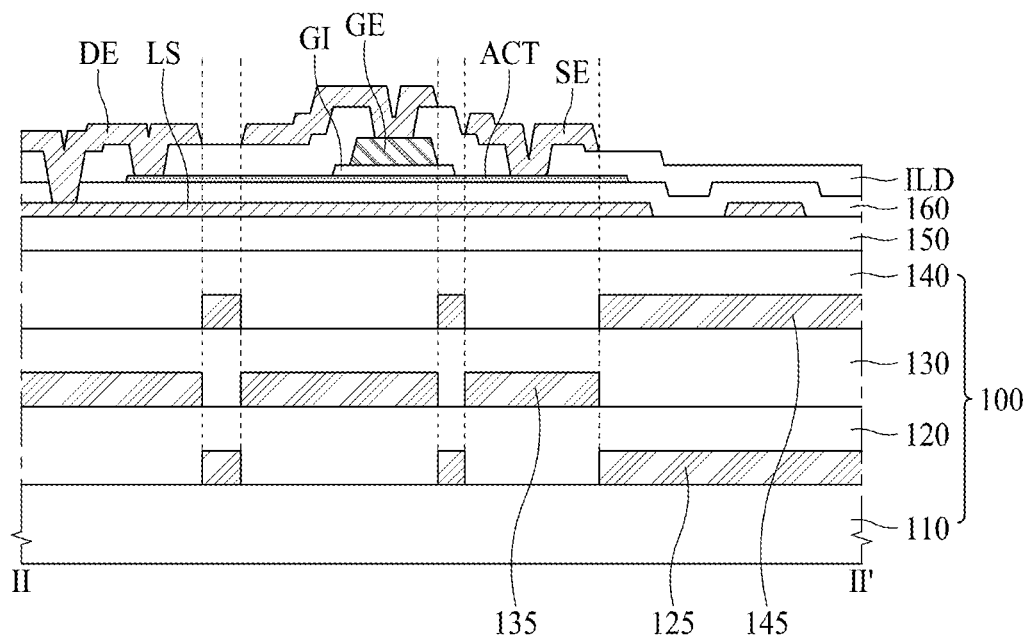
FIG. 7 is a cross-sectional view taken along line II-II' of FIG. 6 according to a third aspect of the disclosure.

FIG. 6 is an accumulated plane view illustrating a structure of a portion of a thin film transistor. FIG. 7 is a cross-sectional view taken along line II-II' of FIG. 6 according to a third aspect of the disclosure. FIG. 6 is an accumulated plane view illustrating that a source electrode and a drain electrode in FIG. 3 are additionally deposited. Hereinafter, the same reference numerals will be given to the same elements as those of FIG. 2 and FIG. 5, and a repeated description will be omitted.

Referring to FIGS. 6 and 7, the display device according to the present disclosure comprises first barrier patterns 125 and 145 and a second barrier pattern 135.

The first barrier patterns 125 and 145 are formed so as not to be overlapped with the gate electrode GE, the source electrode SE and the drain electrode DE. Although the source electrode SE and the drain electrode DE are arranged to be more spaced apart from the substrate 100 than the gate electrode GE, since the source electrode SE and the drain electrode DE are formed of a metal material in the same manner as the gate electrode GE, the source electrode SE and the drain electrode DE may apply a pressed force to the barrier layer 150. Therefore, the first barrier pattern 145 formed in the upper layer 140 is not overlapped with the gate electrode GE, the source electrode SE and the drain electrode DE. In this case, the first barrier patterns 125 and 145 may be regarded as including the first barrier pattern 145 formed in the upper layer 140, and first barrier pattern 125 formed in the second to (2i)th intermediate layers. The first barrier patterns 125 and 145 are the same patterns, and their respective reference numerals are given to these first barrier patterns for convenience.

The second barrier pattern 135 is formed to be overlapped with the gate electrode GE, the source electrode SE and the drain electrode DE. Since the first barrier patterns 125 and 145 are formed so as not to be overlapped with the gate electrode GE, the source electrode SE and the drain electrode DE, the second barrier pattern 135 formed to cross the first barrier patterns 125 and 145 is overlapped with the gate electrode GE, the source electrode SE and the drain electrode DE.

In the display device according to the present disclosure, since the first barrier pattern 145 of the upper layer 140 is formed so as not to be overlapped with the gate electrode GE, the source electrode SE and the drain electrode DE, the first barrier pattern 125 is formed in the second to (2i)th intermediate layers 120 so as not to overlap the barrier pattern formed in layers adjacent to each other, and the second barrier pattern 135 is formed in the first to (2j−1)th intermediate layers, a crack may be prevented from being generated in the barrier layer 150, the accumulated stress applied to the substrate 100 may be suppressed, and water may be prevented from being permeated into the pixels.

Figure 8:
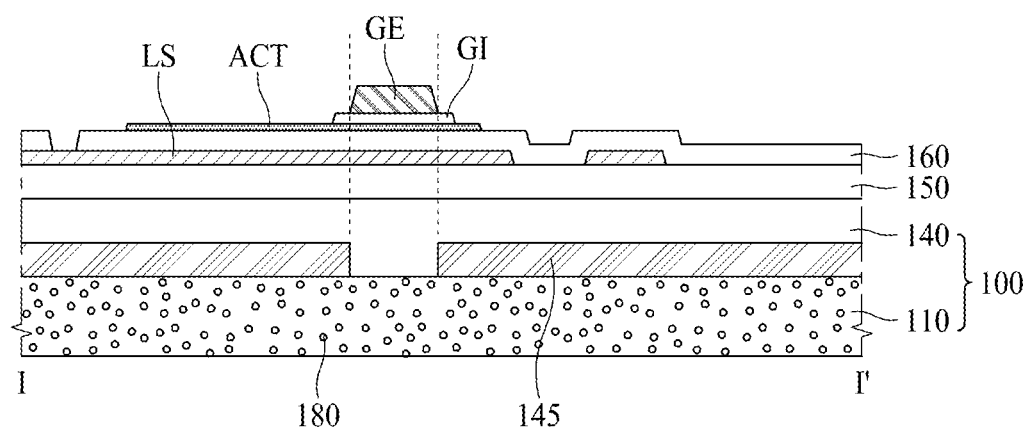
FIG. 8 is a cross-sectional view taken along line I-I' of FIG. 3 according to a fourth aspect of the disclosure.

FIG. 8 is a cross-sectional view taken along line I-I' of FIG. 3 according to the fourth aspect. In FIG. 8, a plurality of pores is additionally formed in the substrate shown in FIG. 4, and a repeated description of FIG. 4 will be omitted.

Referring to FIG. 8, the display device according to a fourth aspect of the present disclosure comprises a substrate 100 having a plurality of pores 180.

The plurality of pores 180 may be formed in such a manner that a soft segment additive is added to the substrate 100, combined with molecules of the substrate 100 and then arranged through coating. Since the substrate 100 includes the plurality of pores 180, a buffering ability may be enhanced, and a cushion effect may be enhanced. Since the buffering ability is enhanced, the substrate 100 which includes the plurality of pores 180 has a high cushion effect even though a plurality of layers are not deposited. Therefore, the thickness of the substrate 100 may be minimized by reducing the number of deposited or stacked layers, whereby the accumulated stress may be suppressed.

Although FIG. 8 illustrates that the plurality of pores 180 are formed in the lower layer 110, the pores 180 may be formed in the upper layer 140 and the first to Nth intermediate layers without limitation to the example of FIG. 8. The plurality of pores 180 may be formed in one layer or a plurality of layers, and this may be selected in accordance with convenience of the process.

Although the present disclosure is described with reference to the above embodiments, the present disclosure is not limited thereto and can be practiced in various manners. In an embodiment, for instance, a display device includes a substrate (especially a flexible substrate) which may have a first area corresponding to parts (e.g. the TFTs) susceptible to stress accumulation in the display device and a second area other than the first area in the display device. The substrate may be configured to have smaller elastic modulus in the first area than that in the second area. The substrate may include parts in the first area corresponding to at least one of a gate electrode GE, a source electrode SE and a drain electrode DE of the TFTs. The substrate may be formed to have the smaller elastic modulus in the first area by one or more of the following: having less barrier patterns in the first area than in the second area; having pores, recesses, linear voids, trenches in one or more layers of the substrate in combined volume more than in the second area, as viewed in the thickness direction of the display device. The pores, recesses, linear voids, trenches may be filled at least partially with a material different from that of the layer, and may be formed by use of e.g. a block polymer containing a soft block and a hard block.

As described above, according to the present disclosure, the following effects and advantages may be obtained.

The display device according to the present disclosure may prevent a dark spot defect and a crack due to water permeation from being generated, reduce the accumulated stress and has high flexibility.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various aspects described above can be combined to provide further aspects. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the aspects can be modified, if necessary to employ concepts of the various patents, applications and publications to provide yet further aspects.

These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. A display device comprising:
    a substrate having a lower layer and an upper layer;
    a thin film transistor having a gate electrode on the substrate; and
    a barrier pattern disposed between the lower layer and the upper layer,
    wherein the barrier pattern has at least a portion which does not vertically overlap the gate electrode,
    wherein the substrate further includes a first intermediate layer and a second intermediate layer between the lower layer and the upper layer,
    wherein the first intermediate layer is disposed between the second intermediate layer and the upper layer,
    wherein the second intermediate layer is disposed between the first intermediate layer and the lower layer,
    wherein the barrier pattern includes a first barrier pattern and a second barrier pattern, wherein the first barrier pattern is disposed between the first intermediate layer and the upper layer, and
    wherein the second barrier pattern is disposed between the second intermediate layer and the first intermediate layer.

2. The display device according to claim 1, wherein the first barrier pattern and the second barrier pattern do not vertically overlap each other.

3. The display device according to claim 1, wherein the first barrier pattern has at least a portion which does not vertically overlap the gate electrode of the thin film transistor, and the second barrier pattern has at least a portion which vertically overlaps the gate electrode of the thin film transistor.

4. The display device according to claim 1, wherein the thin film transistor further includes a source electrode and a drain electrode, and wherein the first barrier pattern has portions which does not vertically overlap the source electrode and the drain electrode of the thin film transistor, and the second barrier pattern has portions which vertically overlap the source electrode and the drain electrode of the thin film transistor.

5. The display device according to claim 1, wherein at least one of the lower layer and the upper layer includes a plurality of pores.

6. A display device having a substrate including a lower layer and an upper layer, comprising:
    a barrier pattern disposed between the lower layer and the upper layer and preventing moisture penetration into a pixel;
    a thin film transistor having a gate electrode and disposed on the upper layer substrate, wherein the barrier pattern does not vertically overlap the gate electrode;
    first to Nth intermediate layers disposed between the lower layer and the upper layer,
    wherein the first intermediate layer is directly in contact with the upper layer and the Nth intermediate layer is directly in contact with the lower layer (where N includes 0 and a natural number).

7. The display device according to claim 6, wherein the second to N−1th intermediate layers are sequentially stacked between the first intermediate layer and the Nth intermediate layer, and the first barrier pattern is disposed in the upper layer and each of the first to Nth intermediate layers.

8. The display device according to claim 6, wherein the first to Nth intermediate layers include:
    first to (2j−1)th intermediate layers (where j is a natural number smaller than or equal to N+½); and
    second to (2i)th intermediate layers (where i is a natural number smaller than or equal to N/2).

9. The display device according to claim 8, wherein the barrier pattern includes a first barrier pattern and a second barrier pattern, the first barrier pattern is formed in the upper layer and the second to (2i)th intermediate layers, and the second barrier pattern is formed in the first to (2j−1)th intermediate layers.

10. The display device according to claim 9, wherein the first barrier pattern and the second barrier pattern do not vertically overlap each other.

11. The display device according to claim 10, wherein the first barrier pattern does not vertically overlap the gate electrode of the thin film transistor, and the second barrier pattern vertically overlaps the gate electrode of the thin film transistor.

12. The display device according to claim 11, wherein the first barrier pattern does not vertically overlap a source electrode and a drain electrode of the thin film transistor, and the second barrier pattern vertically overlaps the source electrode and the drain electrode of the thin film transistor.

13. The display device according to claim 6, wherein the substrate includes a plurality of pores.

14. The display device according to claim 6, wherein the lower layer includes a plurality of pores.

15. The display device according to claim 6, wherein the barrier pattern includes an inorganic layer.

16. The display device according to claim 6, wherein the substrate includes a flexible material.

17. The display device according to claim 1, further includes a barrier layer disposed on the substrate, the barrier layer overlapping with entire of the barrier pattern.

* * * * *